United States Patent
Jun et al.

(10) Patent No.: US 6,406,948 B1
(45) Date of Patent: Jun. 18, 2002

(54) METHOD FOR FORMING AN ESD PROTECTION NETWORK FOR SOI TECHNOLOGY WITH THE ESD DEVICE FORMED IN AN UNDERLYING SILICON SUBSTRATE

(75) Inventors: Song Jun; Ting Cheong Ang; Sang Yee Loong, all of Singapore (SG); Shyue Fong Quek, Petaling Jaya (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/615,807

(22) Filed: Jul. 13, 2000

(51) Int. Cl.$^7$ ............................................. H01L 21/84
(52) U.S. Cl. ........................ 438/152; 438/237; 438/413
(58) Field of Search ............................. 438/152, 237, 438/155, 296, 300, 413

(56) References Cited

U.S. PATENT DOCUMENTS

| | | | |
|---|---|---|---|
| 5,629,544 A | 5/1997 | Voldman et al. | 257/355 |
| 5,674,761 A | 10/1997 | Chang et al. | 437/29 |
| 5,856,214 A | 1/1999 | Yu | 438/133 |
| 5,889,293 A | * 3/1999 | Rutten et al. | |
| 5,923,067 A | 7/1999 | Voldman | 257/349 |
| 6,195,455 B1 | * 2/2001 | Shida | |
| 6,242,763 B1 | * 6/2001 | Chen et al. | |

OTHER PUBLICATIONS

"Silicon Processing for the VLSI Era", vol. 2, S. Wolf, Lattice Press, Sunset Beach, Ca, c.1990, pp. 66–67.

* cited by examiner

Primary Examiner—Keith Christianson
Assistant Examiner—Stephen W. Smoot
(74) Attorney, Agent, or Firm—George O. Saile; Rosemary L. S. Pike

(57) ABSTRACT

A method for forming an electrostatic discharge device using silicon-on-insulator technology is described. An N-well is formed within a silicon semiconductor substrate. A P+ region is implanted within a portion of the N-well and an N+ region is implanted within a portion of the semiconductor substrate not occupied by the N-well. An oxide layer is formed overlying the semiconductor substrate and patterned to form openings to the semiconductor substrate. An epitaxial silicon layer is grown within the openings and overlying the oxide layer. Shallow trench isolation regions are formed within the epitaxial silicon layer extending to the underlying oxide layer. Gate electrodes and associated source and drain regions are formed in and on the epitaxial silicon layer between the shallow trench isolation regions. An interlevel dielectric layer is deposited overlying the gate electrodes. First contacts are opened through the interlevel dielectric layer to the underlying source and drain regions. The interlevel dielectric layer is covered with a mask that covers the first contact openings. Second contact openings are opened through the interlevel dielectric layer, shallow trench isolations, and the oxide layer to the N+ region and P+ region. The mask is removed. The first and second contact openings are filled with a conducting layer to complete formation of an ESD device.

18 Claims, 5 Drawing Sheets

METHOD FOR FORMING AN ESD PROTECTION NETWORK FOR SOI TECHNOLOGY WITH THE ESD DEVICE FORMED IN AN UNDERLYING SILICON SUBSTRATE

BACKGROUND OF THE INVENTION (1) Field of the Invention

The present invention relates to the fabrication of integrated circuit devices, and more particularly, to a method of forming an electrostatic discharge device using silicon-on-insulator (SOI) technology in the fabrication of integrated circuits.

(2) Description of the Prior Art

Electrostatic discharge (ESD) refers to a high voltage accidentally applied to an integrated circuit. ESD can result from either automated or human handling. If the voltage applied to the gate insulator becomes excessive, the gate oxide can break down. MOSFET devices are particularly vulnerable to ESD damage. Because of this danger, ESD protection transistors are fabricated to direct ESD current away from the circuit it is protecting.

An isolation technology that depends on completely surrounding devices by an insulator is referred to as silicon-on-insulator (SOI) technology. In general, the advantages of SOI technology include simple fabrication sequence, reduced capacitive coupling between circuit elements, and increased packing density. The SOI technology is discussed in *Silicon Processing for the VLSI Era*, Vol. 2, by S. Wolf, Lattice Press, Sunset Beach, CA, c. 1990, pp. 66–67.

The present invention makes an electrostatic discharge (ESD) device using silicon-on-insulator (SOI) technology. SOI technology presents challenges to ESD protection because the presence of the insulator layer (oxide) sandwiched between the two silicon layers prevents the discharge of charges. This may lead to more severe ESD.

A number of patents present a variety of methods to form ESD devices. Co-pending U.S. patent application Ser. No. 09/434,922 (CS-99-156) to the same inventors, filed on Nov. 5, 1999, teaches forming an ESD device within a trench using shallow trench isolation technology. Co-pending U.S. patent application Ser. No. 09/531,786 (CS-99-275) to the same inventors, filed on Mar. 21, 2000, discloses an ESD device using SOI technology. U.S. Pat. No. 5,923,067 to Voldman discloses a three-dimensional CMOS-on-SOI ESD device. U.S. Pat. No. 5,856,214 to Yu shows an ESD device having wells and diodes. U.S. Pat. No. 5,674,761 to Chang et al discloses a P/N diode ESD device. U.S. Pat. No. 5,629,544 to Voldman et al shows an ESD SOI device with trench isolations.

SUMMARY OF THE INVENTION

Accordingly, the primary object of the invention is to provide a process for forming an electrostatic discharge device in the fabrication of integrated circuits.

A further object of the invention is to provide a process for forming an electrostatic discharge device using silicon-on-insulator technology.

Another object of the invention is to provide a process for forming an electrostatic discharge device using silicon-on-insulator technology and having large area diodes under the oxide.

In accordance with the objects of the invention, a method for forming an electrostatic discharge device using silicon-on-insulator technology is achieved. An N-well is formed within a silicon semiconductor substrate. A P+ region is implanted within a portion of the N-well and an N+ region is implanted within a portion of the semiconductor substrate not occupied by the N-well. An oxide layer is formed overlying the semiconductor substrate. The oxide layer is patterned to form openings to the semiconductor substrate. An epitaxial silicon layer is grown within the openings and overlying the oxide layer. Shallow trench isolation regions are formed within the epitaxial silicon layer extending to the underlying oxide layer. Gate electrodes and associated source and drain regions are formed in and on the epitaxial silicon layer between the shallow trench isolation regions. An interlevel dielectric layer is deposited overlying the gate electrodes. First contacts are opened through the interlevel dielectric layer to the underlying source and drain regions. The interlevel dielectric layer is covered with a mask that covers the first contact openings. Second contact openings are opened through the interlevel dielectric layer, shallow trench isolations, and the oxide layer to the N+ region and P+ region. The mask is removed. The first and second contact openings are filled with a conducting layer to complete formation of an electrostatic discharge device in the fabrication of integrated circuits.

BRIEF DESCRIPTION OF THE DRAWINGS

In the accompanying drawings forming a material part of this description, there is shown.

DESCRIPTION OF THE PREFERRED EMBODIMENTS

FIGS. 1–6 illustrate a process for making a thick oxide ESD device using silicon-on-insulator technology. It should be understood by those skilled in the art that the present invention should not be limited to the embodiment illustrated herein, but can be applied and extended without exceeding the scope of the invention.

Figure 1:
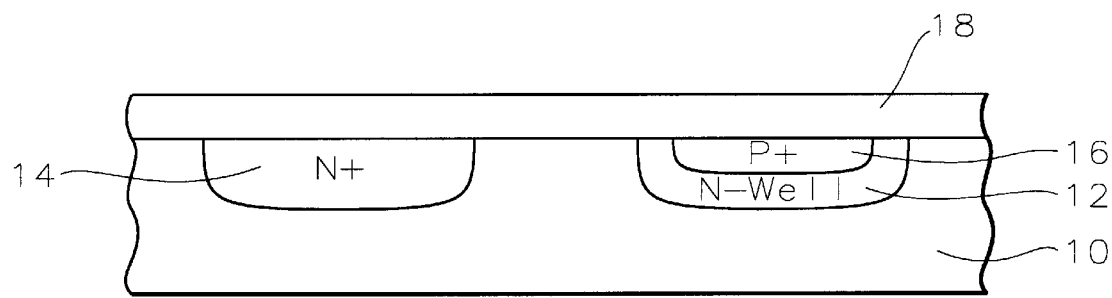
FIGS. 1 through 9 are cross-sectional representations of a preferred embodiment of the present invention.

Referring now more particularly to FIG. 1, there is shown a semiconductor substrate 10, preferably composed of monocrystalline silicon and doped to be P-type silicon. An N-well 12 is formed in a portion of the substrate using conventional masking and implanting techniques. The N-well 12 has a depth of between about 100 and 2500 Angstroms into the substrate.

N+ region 14 and P+ region 16 within the N-well are formed as is conventional in the art, for example, by implantation. The N+ region has a depth preferably between about 100 and 2000 Angstroms and a dopant concentration of between about 1E14 and 5E15 atoms/cm$^3$. The P+ region has a depth preferably between about 100 and 2000 Angstroms and a dopant concentration of between about 1E14 and 5E15 atoms/cm$^3$.

A silicon oxide layer 18 is formed by low pressure chemical vapor deposition (LPCVD), plasma-enhanced chemical vapor deposition (PECVD) or furnace process, for example, on the surface of the silicon substrate to a thickness of between about 1000 and 2000 Angstroms.

Figure 2:
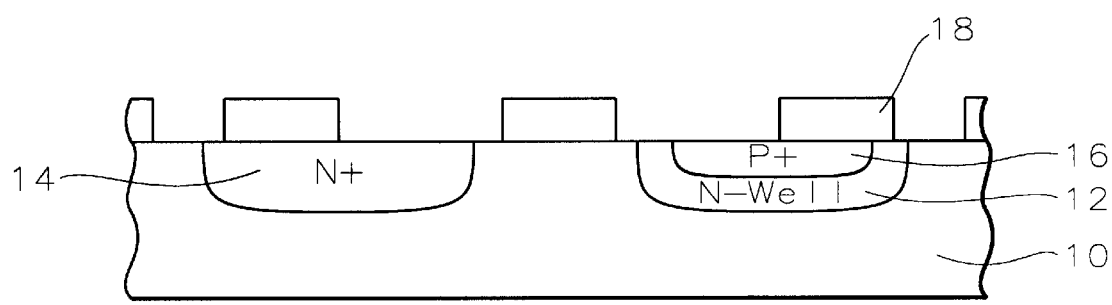

Referring now to FIG. 2, the oxide layer is patterned to form openings through the oxide layer to the underlying substrate for the purpose of epitaxial growth. The openings are of varying sizes depending upon the layout design of the structures and transistors. The openings should have a minimum width of about 2 to 4 times the contact size for any given technology.

Figure 3:
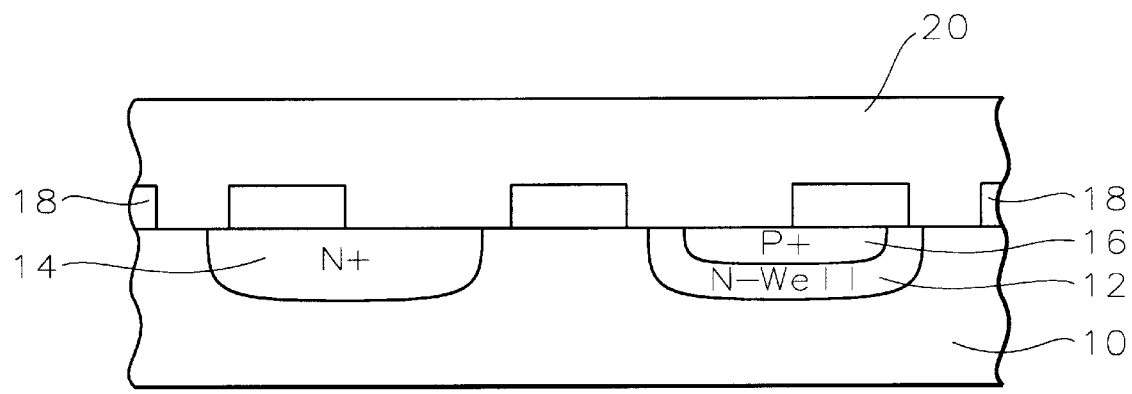

Referring now to FIG. 3, a silicon layer 20 is epitaxially grown through the openings and overlying the oxide layer 18 to a thickness of between about 500 and 3000 Angstroms. This completes formation of the silicon-on-insulator structure having an N-well and N+ and P+ regions within the bottom-most silicon layer.

Figure 4:
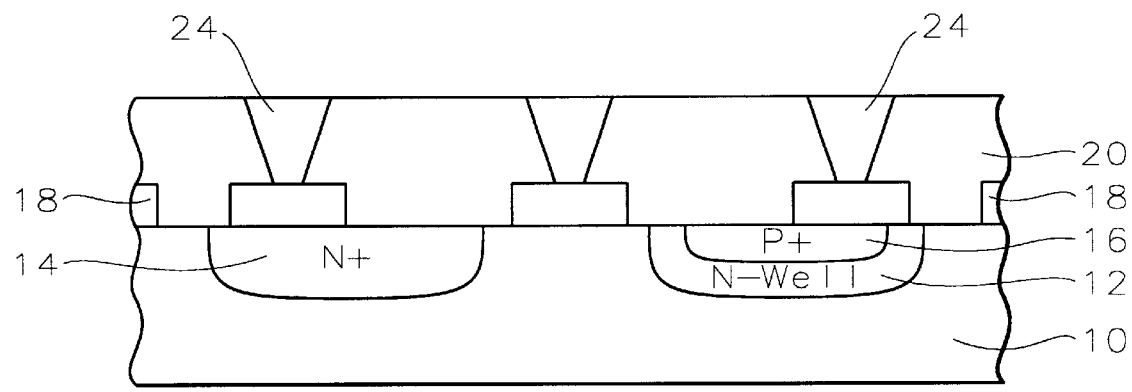

Shallow trench isolation (STI) regions 24 are formed in the epi-silicon layer 20, using a conventional process, as shown in FIG. 4. The STI regions 24 must extend all the way through the silicon layer 20 to the oxide layer 18 so as to provide isolation between the silicon islands.

Figure 5:
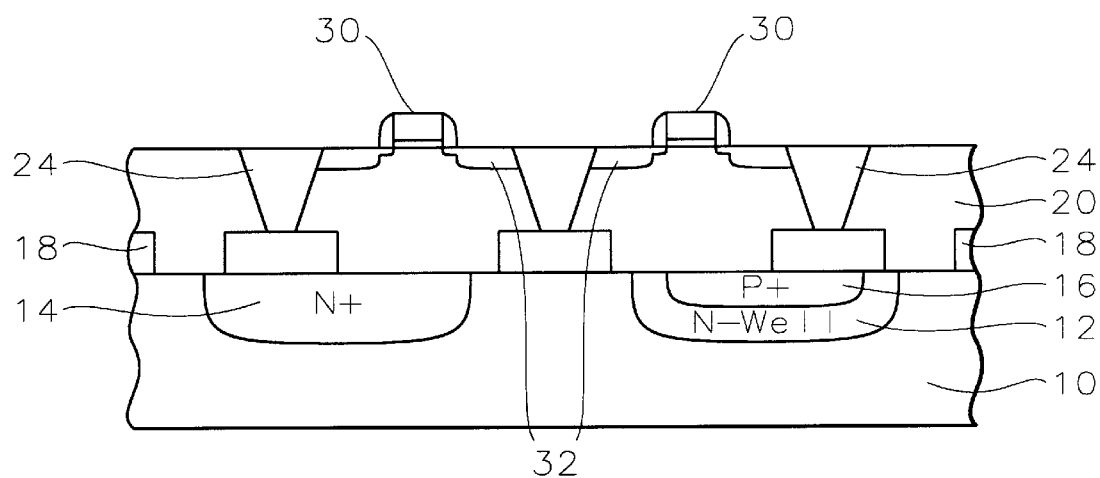

Gate electrodes 30 are formed, as shown in FIG. 5, by conventional means. A polysilicon, polysilicon/tungsten silicide, silicon germanium, or polysilicon/aluminum layer is deposited over a gate oxide layer and patterned to form gate electrodes. LDD and source/drain implantations, using gate sidewall spacers as masks, are performed. Source/drain regions 32 are shown associated with gate electrodes 30. The gate electrodes and source/drain regions form transistors.

Figure 6:
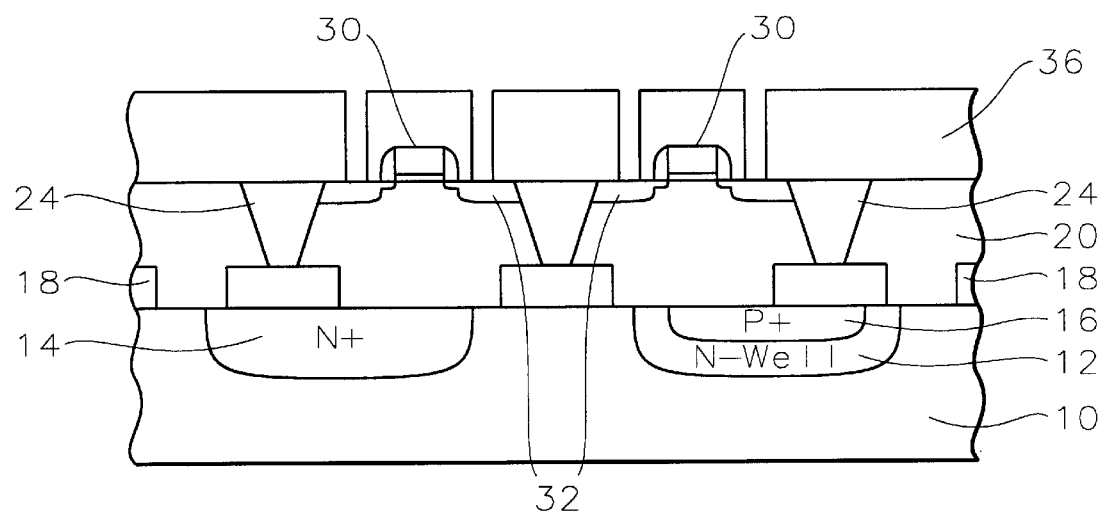
Figure 7:
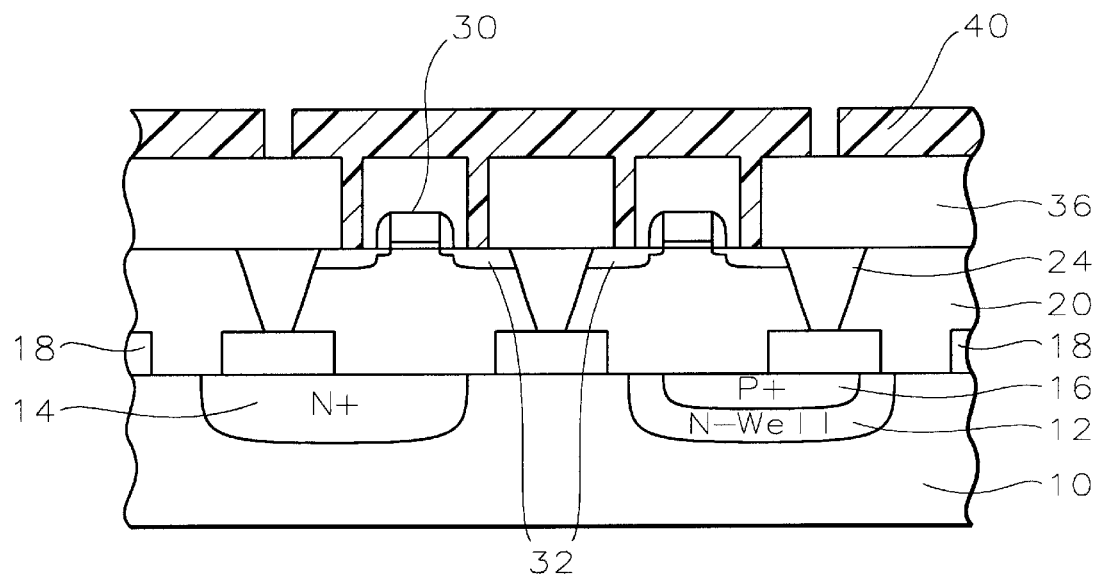

Referring now to FIG. 6, an interlevel dielectric layer (ILD) 36 is blanket deposited over the substrate to a thickness of between about 6000 to 20,000 Angstroms. This layer may comprise subatmospheric borophosphosilicate glass, fluorosilicate glass, or undoped silicate glass, for example. Contacts are etched through the ILD layer 36 to the underlying source/drain regions 32, using a photoresist mask, not shown, or self-aligned contact etching. A photoresist layer 40 is coated over the ILD layer and filling the contacts to the source/drain regions, as shown in FIG. 7. The photoresist layer is patterned to form openings where contacts to the diodes (that is, the N+ region 14 and the P+ region 16) are to be made. The diodes will form the electrostatic discharge device.

Figure 8:
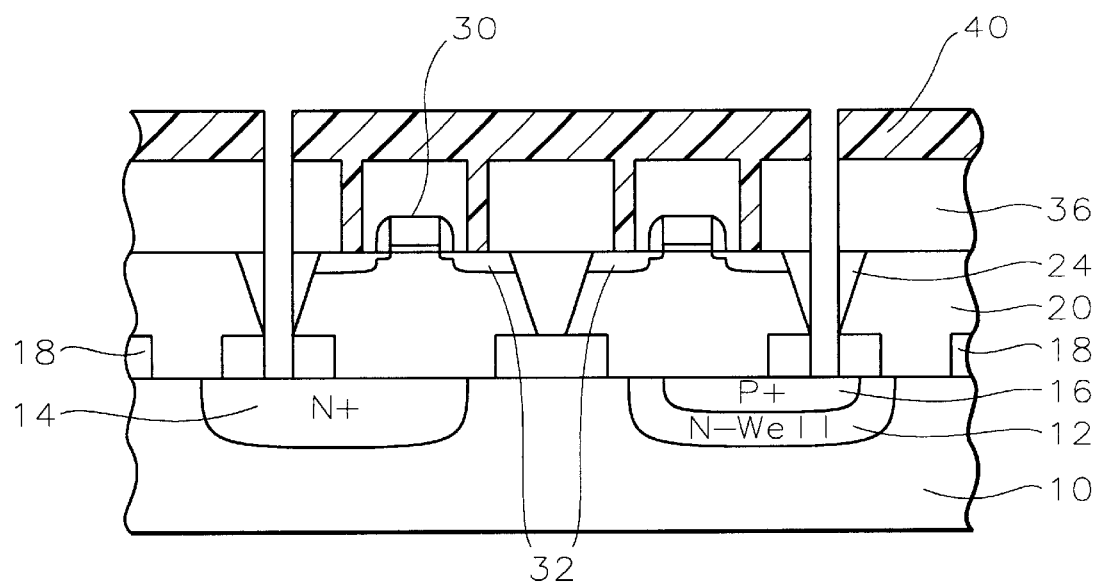

As shown in FIG. 8, contact openings are etched through the ILD layer 36, STI regions 24, and oxide layer 18 to the N+ diode 14 and the P+ diode 16.

Figure 9:
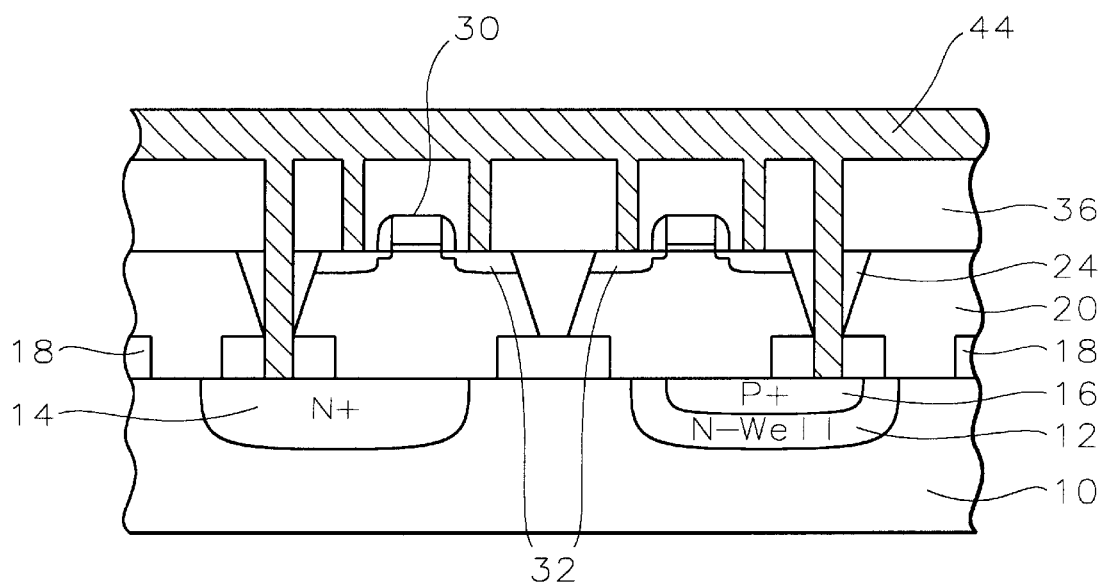

The photoresist mask 40 is removed and a metal layer 44 is deposited over the ILD layer, filling the contacts to the source/drain regions and filling the contacts to the diodes, as shown in FIG. 9. The metal layer may comprise tungsten, copper, or aluminum/copper, for example.

This completes formation of the electrostatic discharge device. The process of the present invention results in the formation of an electrostatic discharge device having large area diodes under the oxide layer of a silicon-on-insulator device and contacts to sources and drains. In the present invention, the diodes are located in the lower silicon layer not used to fabricate transistors. Thus, the size of the diodes does not impose a limitation or restriction on silicon real estate. Large area diodes provide robust ESD protection. Higher voltages can be withstood by such a design. These large area diodes may be 2 $\mu$m by 2 $\mu$m up to hundreds of $\mu$m in area.

Figure 10:
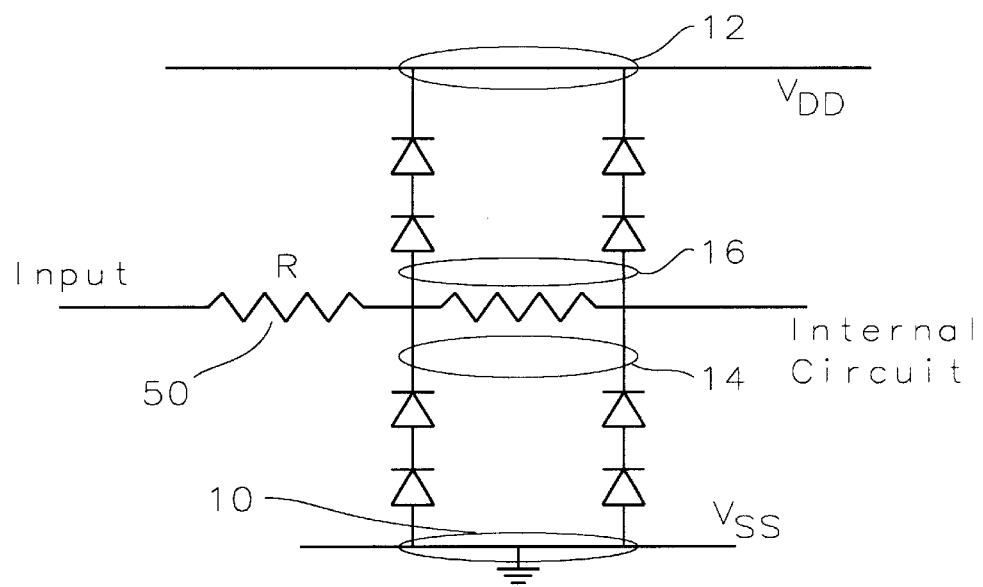
FIG. 10 is a schematic representation of an electrostatic discharge protection network of the present invention.

FIG. 10 is a schematic of the ESD protection network of the present invention. The numbered areas relate the schematic to the cross-section in FIG. 9. 50 is a polysilicon line.

While the invention has been particularly shown and described with reference to the preferred embodiments thereof, it will be understood by those skilled in the art that various changes in form and details may be made without departing from the spirit and scope of the invention.

What is claimed is:

1. A method of forming an electrostatic discharge device in the fabrication of integrated circuits comprising:

forming an N-well within a silicon semiconductor substrate;

implanting a P+ region within a portion of said N-well and implanting a N+ region within a portion of said semiconductor substrate not occupied by said N-well;

forming an oxide layer overlying said semiconductor substrate;

patterning said oxide layer to form openings to said semiconductor substrate;

growing an epitaxial silicon layer within said openings and overlying said oxide layer;

forming shallow trench isolation regions within said epitaxial silicon layer extending to underlying said oxide layer;

forming gate electrodes on said epitaxial silicon layer and associated source and drain regions in said epitaxial silicon layer wherein both said gate electrodes and said associated source and drain regions are formed between said shallow trench isolation regions;

depositing an interlevel dielectric layer overlying said gate electrodes;

opening first contacts through said interlevel dielectric layer to underlying said source and drain regions;

covering said interlevel dielectric layer with a mask wherein said mask covers said first contact openings;

opening second contact openings through said interlevel dielectric layer, said shallow trench isolations, and said oxide layer to said N+ region and said P+ region;

thereafter removing said mask; and filling said first and second contact openings with a conducting layer to complete formation of said electrostatic discharge device in said fabrication of integrated circuits.

2. The method according to claim 1 wherein said oxide layer has a thickness of between about 1000 and 2000 Angstroms.

3. The method according to claim 1 wherein said epitaxial silicon layer has a thickness of between about 500 and 3000 Angstroms.

4. The method according to claim 1 wherein said interlevel dielectric layer comprises one of the group containing sub-atmospheric borophosphosilicate glass, fluorosilicate glass, and undoped silicate glass and has a thickness of between about 6000 and 20,000 Angstroms.

5. The method according to claim 1 wherein said conducting layer comprises one of the group containing aluminum/copper, copper, and tungsten.

6. The method according to claim 1 wherein said N+ and P+ regions form diodes of said electrostatic discharge device.

7. The method according to claim 6 wherein said diodes have an area of 4 square microns or greater.

8. A method of forming an electrostatic discharge device in the fabrication of integrated circuits comprising:

forming an N-well within a silicon semiconductor substrate;

implanting a P+ region within a portion of said N-well and implanting a N+ region within a portion of said semiconductor substrate not occupied by said N-well wherein said P+ region and said N+ region form diodes of said electrostatic discharge device;

forming an oxide layer overlying said semiconductor substrate;

patterning said oxide layer to form openings to said semiconductor substrate in planned active areas;

growing an epitaxial silicon layer within said openings and overlying said oxide layer;

forming shallow trench isolation regions within said epitaxial silicon layer between said planned active areas wherein said shallow trench isolation regions extend to underlying said oxide layer;

forming gate electrodes on said epitaxial silicon layer and associated source and drain regions in said epitaxial silicon layer wherein both said gate electrodes and said associated source and drain regions are formed between said shallow trench isolation regions;

depositing an interlevel dielectric layer overlying said gate electrodes;

opening first contacts through said interlevel dielectric layer to underlying said source and drain regions;

covering said interlevel dielectric layer with a mask wherein said mask covers said first contact openings;

opening second contact openings through said interlevel dielectric layer, said shallow trench isolations, and said oxide layer to diodes;

thereafter removing said mask; and filling said first and second contact openings with a conducting layer to complete formation of said electrostatic discharge device in said fabrication of integrated circuits.

9. The method according to claim 8 wherein said oxide layer has a thickness of between about 1000 and 2000 Angstroms.

10. The method according to claim 8 wherein said epitaxial silicon layer has a thickness of between about 500 and 3000 Angstroms.

11. The method according to claim 8 wherein said interlevel dielectric layer comprises one of the group containing sub-atmospheric borophosphosilicate glass, fluorosilicate glass, and undoped silicate glass and has a thickness of between about 6000 and 20,000 Angstroms.

12. The method according to claim 8 wherein said conducting layer comprises one of the group containing aluminum/copper, copper, and tungsten.

13. The method according to claim 8 wherein said diodes have an area of 4 square microns or greater.

14. A method of forming an electrostatic discharge device in the fabrication of integrated circuits comprising:

forming an N-well within a silicon semiconductor substrate;

implanting a P+ region within a portion of said N-well and implanting a N+ region within a portion of said semiconductor substrate not occupied by said N-well wherein said P+ region and said N+ region form diodes of said electrostatic discharge device and wherein said diodes have an area of at least 4 square microns and as much as hundreds of square microns;

forming an oxide layer overlying said semiconductor substrate;

patterning said oxide layer to form openings to said semiconductor substrate in planned active areas;

growing an epitaxial silicon layer within said openings and overlying said oxide layer;

forming shallow trench isolation regions within said epitaxial silicon layer between said planned active areas wherein said shallow trench isolation regions extend to underlying said oxide layer;

forming gate electrodes on said epitaxial silicon layer and associated source and drain regions in said epitaxial silicon layer wherein both said gate electrodes and said associated source and drain regions are formed between said shallow trench isolation regions;

depositing an interlevel dielectric layer overlying said gate electrodes;

opening first contacts through said interlevel dielectric layer to underlying said source and drain regions;

covering said interlevel dielectric layer with a mask wherein said mask covers said first contact openings;

opening second contact openings through said interlevel dielectric layer, said shallow trench isolations, and said oxide layer to diodes;

thereafter removing said mask; and filling said first and second contact openings with a conducting layer to complete formation of said electrostatic discharge device in said fabrication of integrated circuits.

15. The method according to claim 14 wherein said oxide layer has a thickness of between about 1000 and 2000 Angstroms.

16. The method according to claim 14 wherein said epitaxial silicon layer has a thickness of between about 500 and 3000 Angstroms.

17. The method according to claim 14 wherein said interlevel dielectric layer comprises one of the group containing sub-atmospheric borophosphosilicate glass, fluorosilicate glass, and undoped silicate glass and has a thickness of between about 6000 and 20,000 Angstroms.

18. The method according to claim 14 wherein said conducting layer comprises one of the group containing aluminum/copper, copper, and tungsten.

* * * * *